United States Patent
Bolz et al.

(10) Patent No.: US 7,327,543 B2
(45) Date of Patent: Feb. 5, 2008

(54) METHOD AND DEVICE FOR SWITCHING A SEMI-CONDUCTOR CIRCUIT BREAKER

(75) Inventors: Stephan Bolz, Pfatter (DE); Tudor-Ion Gamulescu, Freising (DE); Rainer Knorr, Regensburg (DE); Günter Lugert, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 248 days.

(21) Appl. No.: 10/531,110

(22) PCT Filed: Sep. 5, 2003

(86) PCT No.: PCT/DE03/02957

§ 371 (c)(1),
(2), (4) Date: Apr. 11, 2005

(87) PCT Pub. No.: WO2004/034583

PCT Pub. Date: Apr. 22, 2004

(65) Prior Publication Data

US 2006/0034138 A1  Feb. 16, 2006

(30) Foreign Application Priority Data

Oct. 9, 2002  (DE) .............................. 102 47 109

(51) Int. Cl.
*H02H 3/00* (2006.01)
*H02H 32/42* (2006.01)

(52) U.S. Cl. ...................... 361/91.5; 361/93.7; 361/98
(58) Field of Classification Search ............... 361/91.5, 361/93.7, 98

See application file for complete search history.

(56) References Cited

U.S. PATENT DOCUMENTS

| 5,465,190 | A | 11/1995 | Meunier et al. |
| 5,640,293 | A * | 6/1997 | Dawes et al. ............... 361/93.7 |
| 6,052,268 | A | 4/2000 | Thomas |
| 6,341,073 | B1 | 1/2002 | Lee |
| 6,347,028 | B1 | 2/2002 | Hausman, Jr. et al. |
| 6,400,581 | B1 | 6/2002 | Lee |
| 6,839,254 | B2 | 1/2005 | Rampold et al. |

FOREIGN PATENT DOCUMENTS

| DE | 200 10 283 U1 | 8/2001 |
| WO | WO 00/19572 | 4/2000 |
| WO | WO 00/79681 A1 | 12/2000 |

OTHER PUBLICATIONS

Horowitz et al., The Art of Electronics, 1989, 2nd ed., Cambridge University Press, pp. 23-24.*
LM2903 Data Sheet, ON Semiconductor, pp. 1., Semiconductor Components Industries, LLC, 2006.*

* cited by examiner

*Primary Examiner*—Michael Sherry
*Assistant Examiner*—Zeev Kitov
(74) *Attorney, Agent, or Firm*—Laurence A. Greenberg; Werner H. Stemer; Ralph E. Locher

(57) ABSTRACT

The invention relates to a method for switching a semi-conductor circuit breaker by means of which the resistance of the breaker gap of the semi-conductor circuit breaker is controlled by a control voltage (Vst), such that the power loss (Pist) from the circuit breaker does not exceed a predetermined setpoint (Psoll). The invention also relates to a device for carrying out said method wherein a transfer gate, which is controlled by a charge pump, is used as a semi-conductor circuit breaker.

10 Claims, 4 Drawing Sheets

METHOD AND DEVICE FOR SWITCHING A SEMI-CONDUCTOR CIRCUIT BREAKER

BACKGROUND OF THE INVENTION

Field of the Invention

The invention relates to a method for switching a semi-conductor circuit breaker, in particular a semi-conductor circuit breaker arranged between two energy storage devices in a wiring system of the vehicle equipped with an integrated starter generator. It also relates to a device for implementing said method.

In a wiring system of the vehicle with ISG, switching processes are necessary between the energy storage devices—accumulators of different nominal voltages and capacitors (intermediate circuit capacitors, double layer capacitors)—via static frequency changers or switching regulators by means of circuit breakers which are carried out on the commands of a control unit.

A requirement in this case is that before a switch is opened, the switch current flowing through it is brought to 0 A and that before a switch is closed, the switch voltage between its switching contacts is brought to 0V.

A switch current 0 A can be carried out, for example, by disabling an AC/DC static frequency changer or a DC/DC switching regulator and causes no problem in practice.

Regulation to the 0V switch voltage, i.e. no potential difference between the poles of the (opened=non-conductive) switch, usually takes place by purposefully reversing the charge of one of the energy storage devices, for example, an intermediate circuit capacitor because this capacitor is usually the smaller energy storage device. In principle, this regulation can also be carried out by means of a static frequency changer or a switching regulator positioned between said static frequency changer and the wiring system of the vehicle.

The intermediate circuit capacitor for example has a capacity of several 10.000 µF, the double layer capacitor for example a capacity of 200 F and the accumulators a capacity of several Ah. The switch voltage to be equalized can be up to a voltage of 60V.

However, determined by the unfavorable ratio of the power of the static frequency changer (e.g. 6 kW) or the switching regulator (e.g. 1 kW) to the energy required for charge equalizing (up to 40 joules), stringent limits have also been set in practice for voltage equalizing.

If now for example, for reasons of reliability and space requirements, semi-conductor switches are used as switches, the accuracy of voltage equalizing which can be achieved in this way is not sufficient.

Currents and power outputs occurring during normal operation require the application of components (capacitors, switches) with very low resistances. In the case of existing voltage differences, the equalizing currents are accordingly high via the switch to be closed. In extreme cases, this leads to a destruction of the semi-conductor.

A limitation of the equalizing current flowing through the switch to a safe value requires a current measurement, which necessitates a cost-intensive current sensor at the peak of the occurring currents. In addition, the equalizing process cannot be carried out time-optimized because in the case of an excessive switch voltage, the power loss in the switch is high which represents a further possible limitation.

It is the object of the invention to create a method and a corresponding device for actuating a semi-conductor circuit breaker which functions without a cost-intensive current sensor and in the case of which the transient effect and the closed circuit condition are controlled in such a way that also in the case of a high voltage difference at the switch, the power loss in semi-conductors is limited to a safe value and kept constant so that damage to the semi-conductor is excluded.

SUMMARY OF THE INVENTION

The invention includes the technical theory to control the resistance of the breaker gap of the semi-conductor circuit breaker (S1, S2) by a control voltage Vst to such an extent that the power loss Pist from the circuit breaker (S1, S2) does not exceed a predetermined setpoint Psoll.

The power loss Pist from the circuit breaker is determined from the differential voltage Vdiff between the connections of the circuit breaker as is explained in greater detail below.

This power loss Pist is then regulated to a predetermined setpoint Psoll, in which case the controlled variable is used as the control signal in order to generate the control voltage.

According to the invention, provision is made for embodying the switch as a transfer gate and for controlling it in such a way by means of a charge pump, that the power loss can be controlled at the switch and limited to a predetermined setpoint.

BRIEF DESCRIPTION OF THE DRAWING

An embodiment of the invention is explained below on the basis of the accompanying drawing. The drawings show.

Referring to the device, the method according to the invention is explained in greater detail on the basis of the embodiments.

DESCRIPTION OF THE PREFERRED EMBODIMENTS

Figure 1:
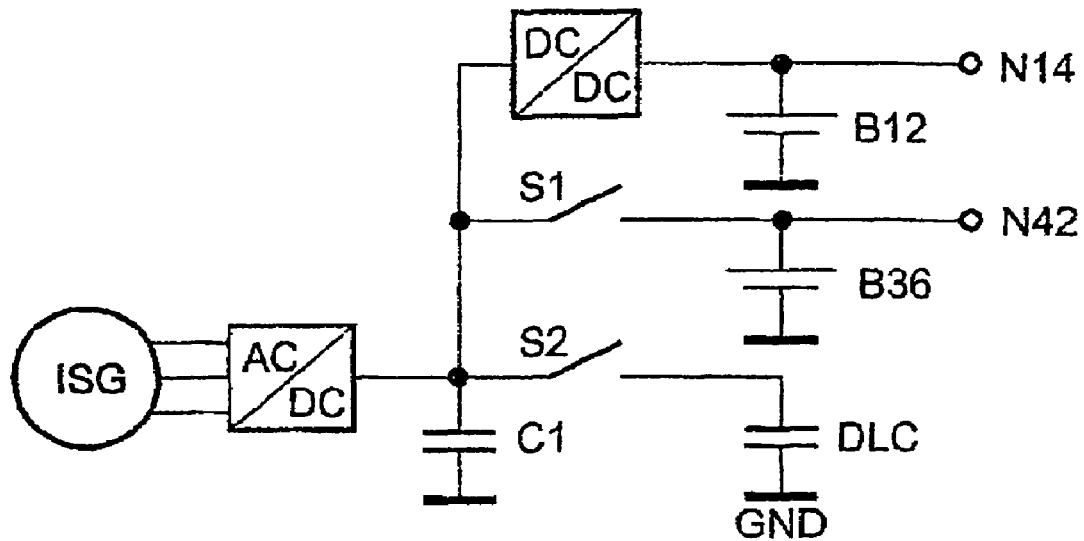
FIG. 1 a basic circuit diagram of a 14V/42V wiring system of a vehicle.

FIG. 1 is a basic circuit diagram of a 14V/42V wiring system of a vehicle with an integrated starter generator ISG connected to an internal combustion engine (not shown) on the basis of which the invention is explained.

This ISG is connected by means of a bidirectional AC/DC converter AC/DC a) directly to an intermediate circuit capacitor C1,
b) via a circuit breaker S2 to a double layer capacitor DLC,
c) via a circuit breaker S1 to a 36V accumulator B36 and a 42V wiring system of a vehicle, and
d) via a bi-directional DC/DC converter DC/DC to a 12V accumulator B12 and a 14V wiring system of a vehicle N14.

According to the invention, each circuit breaker (S1 and S2) should be embodied as a transfer gate which is controlled by a charge pump actuated by the commands from a control unit which is not shown.

Figure 2:
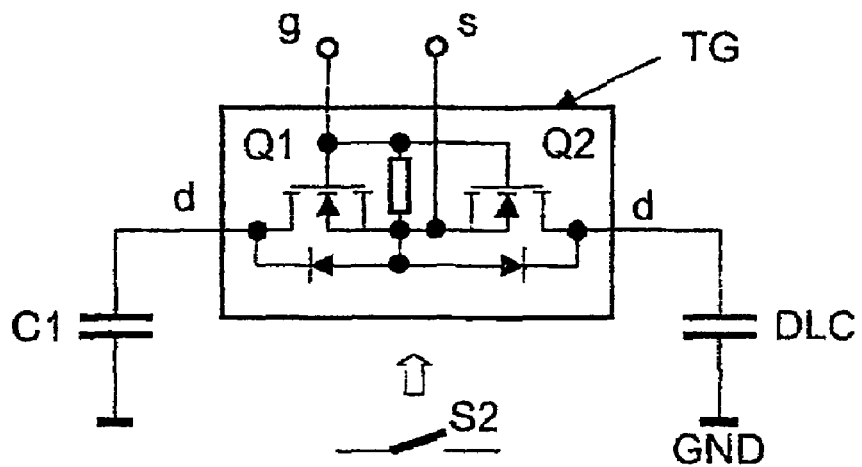
FIG. 2 a basic circuit diagram of a semi-conductor circuit breaker embodied as a transfer gate, FIG. 3 the circuit of a transfer gate which can be controlled by means of a charge pump, FIG. 4 a differential amplifier with a rectifier to determine the voltage of the switch, FIG. 5 an analog computer to determine the power loss at the switch with a two-state controller connected downstream, and FIG. 6 a flow diagram to determine the power loss from the switch.

FIG. 2 is a basic circuit diagram of a switch embodied as a transfer gate TG, for example, for the switch S2 which is arranged between the intermediate circuit capacitor C1 and the double layer capacitor DLC. If further switches other than the switches embodied as a transfer gate are required, they will be embodied identically.

The transfer gate TG consists of two MOSFET transistors Q1 and Q2 connected in series whose source connections s and gate connections g are interconnected in each case. The drain connections d serve as input E or output A of the switch.

Because in the wiring system of a vehicle, the voltage differences Vdiff and the current directions at the switch can have any leading sign or any direction, two semi-conductors or semi-conductor groups connected in series must be used of which at least one of them is blocked in each case. Such an arrangement is known as the transfer gate, which practices the actual switching function.

The control of such a switch embodied as a transfer gate takes place by applying a control voltage between the source connection and the gate connection. In order to reduce the control voltage, a resistor not described in greater detail in this case is provided between the gate and the source connection.

Figure 3:
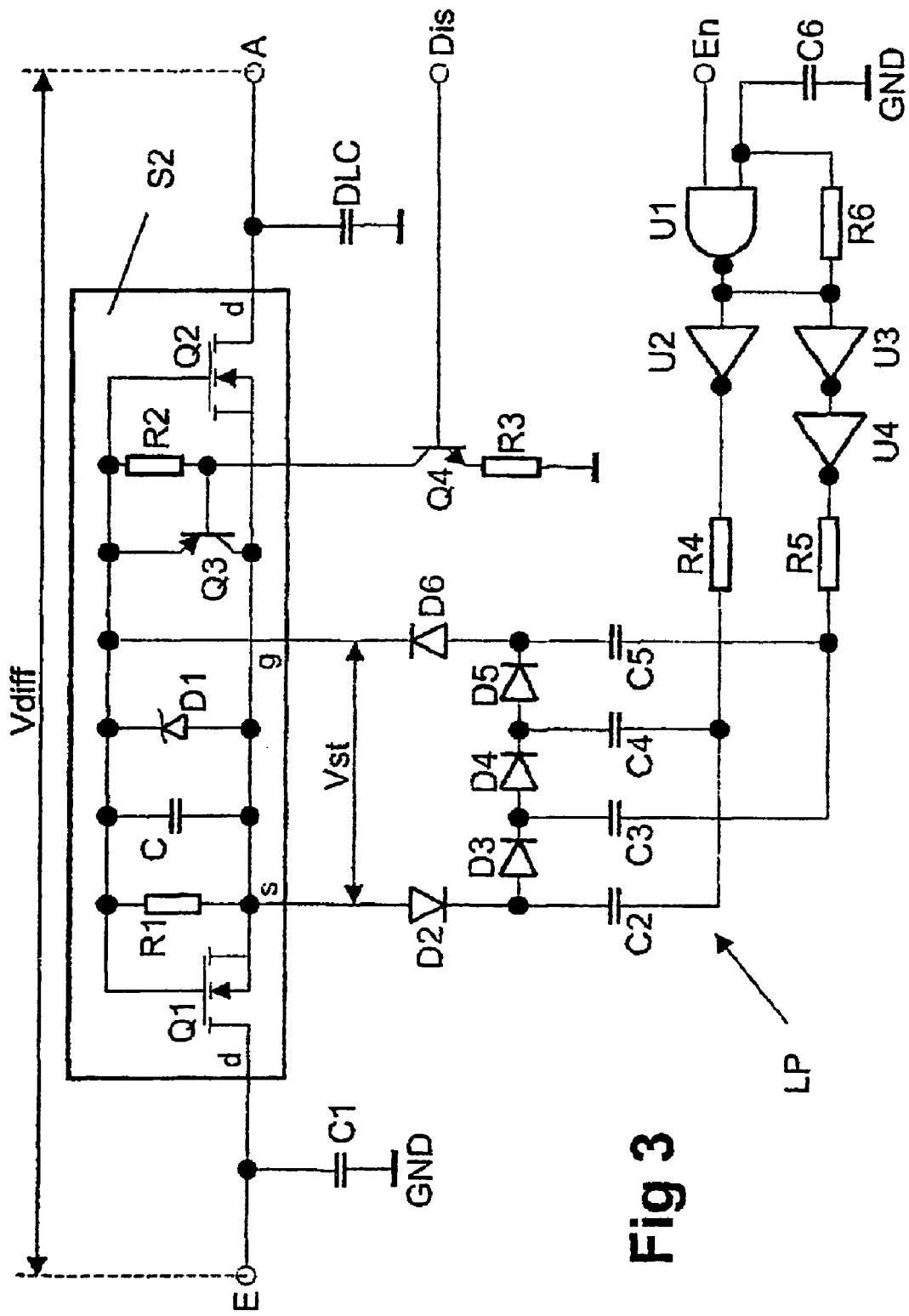

In FIG. 3, the circuit of switch S2 embodied as a transfer gate which can be controlled by a charge pump, said circuit being arranged between the intermediate circuit capacitor C1 and the double layer capacitor DLC, is shown once more. In addition, it is possible that by means of a signal Dis via a further transistor Q3 arranged in the transfer gate (and an external transistor Q4), the control voltage can be short-circuited in order to open the transfer gate quickly (to be controlled in a non-conductive manner).

The known charge pump LP (capacitors C2 up to C5 and diodes D3 up to D5) sets up a control voltage between the source connection and the gate connection of the transfer gate (switch 2). It is supplied by a gate oscillator (logical circuit elements U1 up to U4) having an enable function. In this way, both the oscillator and the charge pump LP can be enabled and disabled by a logical control signal En (enable). The generation of this control signal En is explained further below.

By enabling the charge pump LP by means of a signal En (enable), a positive control voltage is set up between the source connection and the gate connection as a result of which switch S2 (transfer gate) accordingly becomes conductive. After the disabling process, this voltage is again reduced as a result of which switch S2 again becomes non-conductive. The enabling and disabling takes place controlled in time, i.e. by means of explicitly enabling and disabling the charge pump, the transfer gate can be kept in an analog conductive state.

Figure 4:
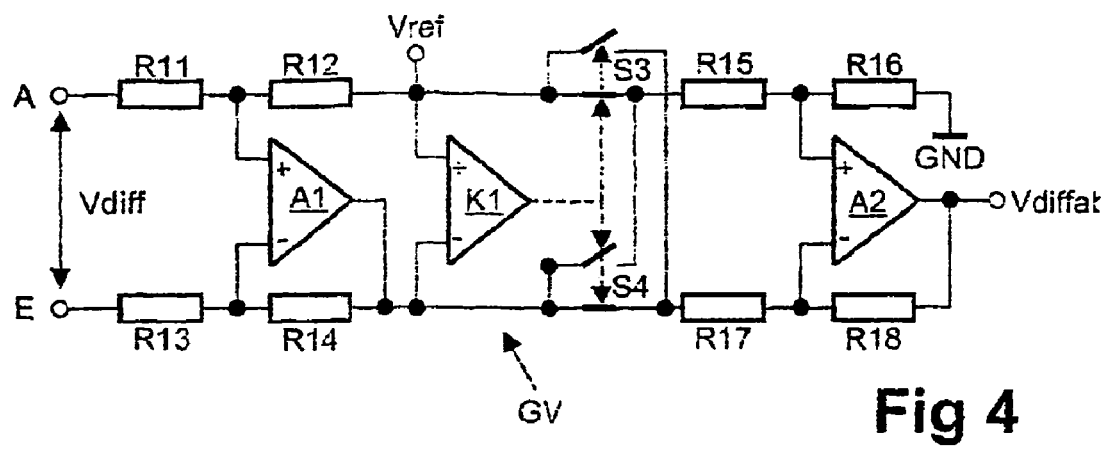

The voltage (potential difference) Vdiff between the connections A and E of switch S2 (transfer gate) is determined by a subsequent voltage transmitter GV shown in FIG. 4 and converted to an absolute value Vdiffabs of the switch voltage referred to a reference potential GND. The voltage Vdiff is recorded in a differential amplifier A1 and R11 to R14 and converted to a direct voltage referred to a predetermined reference voltage Vref. If the potential difference is 0V, then a voltage Vref can be tapped at the output of the differential amplifier A1.

A rectifier K1 connected downstream of the differential amplifier A1 evaluates the output signal of the differential amplifier A1 referred to the reference voltage Vref. It controls two interconnected switches S3 and S4 (for example, two CMOS change-over switches) so that a subsequent, second differential amplifier A2 to which resistors R15 to R18 are allocated, always keeps a positive input voltage.

In this way, the absolute value Vdiffabs of the switch voltage Vdiff referred to the reference potential GND is obtained at the output of the differential amplifier A2.

In order to determine the power loss from the switch Pist, this absolute value Vdiffabs of the switch voltage must be prepared further.

In order to avoid a costly measuring of the switch current $I_S$, it is also possible to determine it from the differential of the switch voltage Vdiffabs because this current serves to reverse the charge of the intermediate circuit capacitor C1:

$$I_S = C1 * d(V\text{diffabs})/dt, \text{ thus } C1 \text{ is constant} \quad (1)$$

In order to determine the power Pist at the switch, the product of the switch voltage $V_S$ and the switch current $I_S$ must be determined:

$$P\text{ist} = V_S * I_S = V\text{diffabs} * C1 * d(V\text{diffabs})/dt \quad (2)$$

Figure 5:
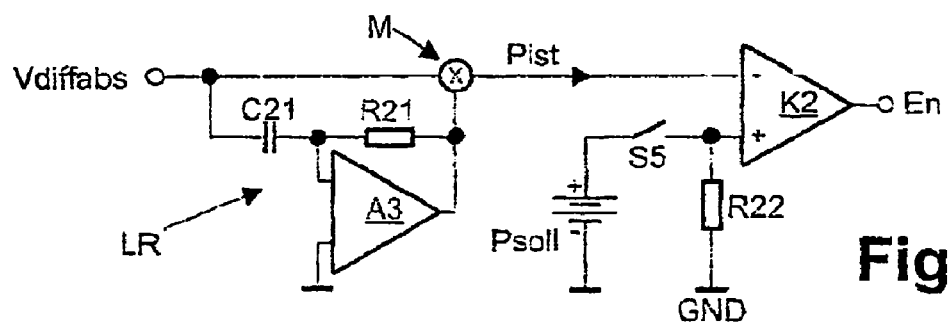

According to FIG. 5, a performance calculator LR is used to calculate the power of the switch Pist. This consists of an analog computer A3 and a multiplier M connected to a capacitor C21 and a resistor R21. The analog computer A3 calculates, according to formula 2, the differential d(Vdiffabs)/dt in time from the input variable Vdiffabs which is multiplied in the multiplier M by the input variable Vdiffabs.

In this case, the value of the intermediate circuit capacitor C1 is taken into account as the amplification factor. However, it can also be taken into account by varying the setpoint Psoll of a subsequently described two-state controller K2. The output signal of the multiplier M is proportional to the power of the switch Pist.

In a subsequent two-state controller K2, the output signal Pist of the multiplier M is regulated to a setpoint Psoll which serves as the command variable which, as a voltage value corresponding to the setpoint Psoll, is applied to the non-inverting input of the two-state controller K2. The non-inverting input of the two-state controller K2 is connected directly to the reference potential GND via a resistor R22. The setpoint Psoll is supplied to the non-inverting input of the two-state controller K2 via a switch S3. Signal En can be tapped at the output of the two-state controller K2, said signal being supplied to the gate oscillator U1 to U4 as a control signal according to FIG. 3:

Pist<Psoll: En=High→the gate oscillator U1 starts oscillating and the charge pump generates an increasing gate voltage as a result of which the transfer gate has a higher conductivity. The switch voltage (between A and E) drops and, as a result, also the measured voltage udiffabs. As a result of this, the value of Pist will carry on increasing until it exceeds the setpoint Psoll.

Pist>Psoll: En=Low→the gate oscillator U1 stops. The charge pump no longer supplies a gate voltage and this drops slowly. If Pist falls below Psoll, the controller K2 again switches to high and the cycle starts once again.

The setpoint Psoll can be disabled by opening switch S3 in which case the resistor R22 then supplies the zero potential and S2 safely goes into the off-state.

Figure 6:
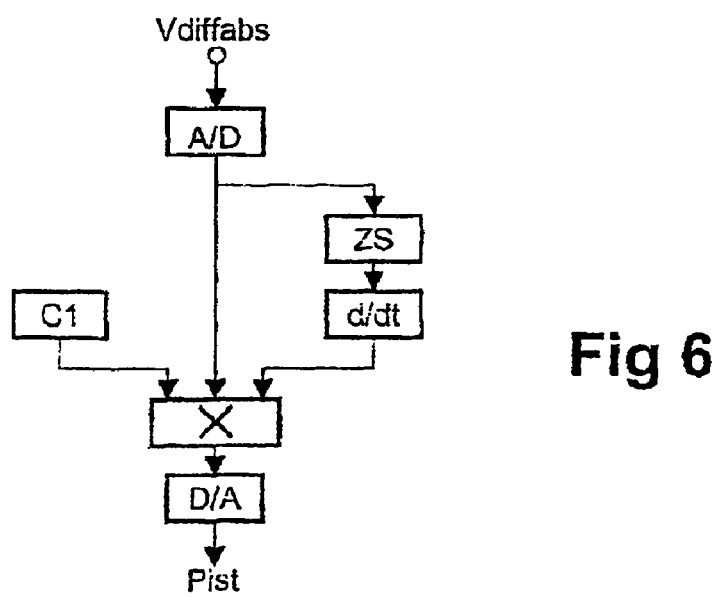

The power of the switch Pist can also be calculated by means of a software program stored in a microcontroller µC whose flow diagram is shown in FIG. 6. As a result of this, the analog computer A3 and the multiplier M are unnecessary.

The output signal Vdiffabs of the differential amplifier A2 (FIG. 4) is digitalized continuously in an A/D converter A/D and stored in an intermediate storage device ZS and subsequently differentiated per software (d/dt).

In a further step, the differential is multiplied (X) by the output signal of the A/D converter A/D and a constant C1 and is then reconverted to an analog value (D/A). This analog value is proportional to the power of the switch Pist and is supplied to the inverting input of the controller K2 (in FIG. 5).

Differentiation and multiplication are costly methods both hardware-specifically and software-specifically. Both methods can be avoided.

Because the relevant system variables (capacity, differential voltage Vdiffabs and the power of the switch Psoll) are known or can be measured, the control loop for controlling the process of reversing the charge can also be simplified.

For these reasons it is possible that—arithmetically or empirically—a time-variable nominal voltage Vsoll(t) allocated to a constant power of the switch Psoll can be determined and stored which is used as the command variable for the process of reversing the charge starting with the differential voltage Vdiffabs at the start of the process of reversing the charge up to the point in time when the process of reversing the charge has ended and Vdiffabs=0V.

Figure 7:
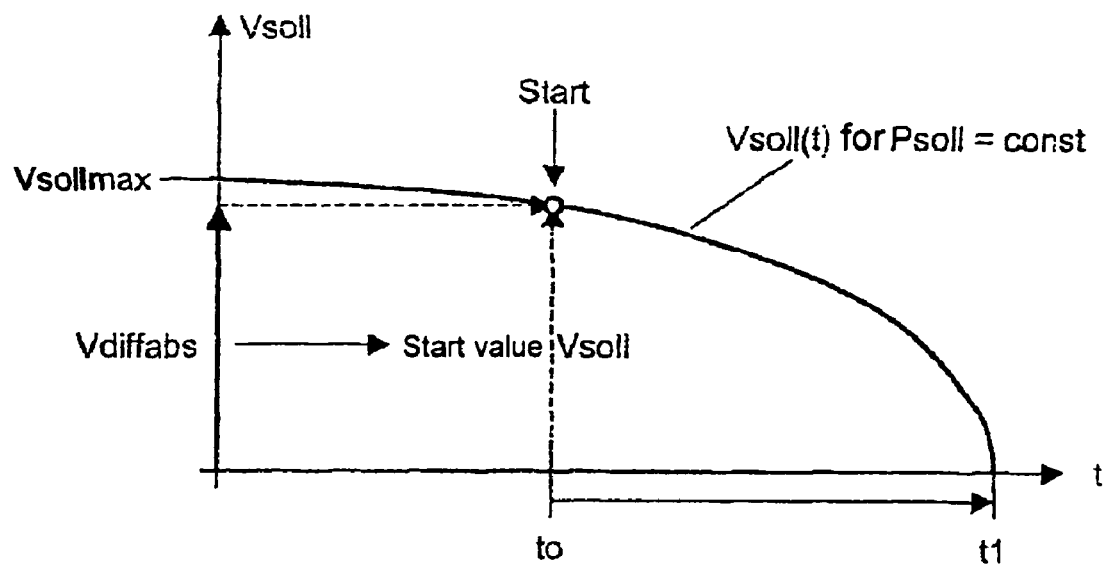
FIG. 7 the graph of the time-variable command variable Vsoll(t)

As can be seen in FIG. 7, a parabolic graph over time is obtained for this curve. The control loop is now controlled by this time-variable voltage Vsoll(t) whose start value corresponds to the current value of the differential voltage Vdiffabs at the beginning (to) of the process of reversing the charge.

Figure 8:
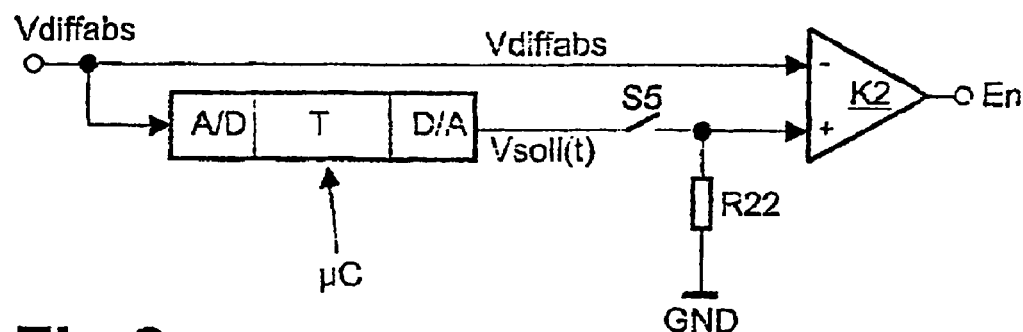
FIG. 8 an alternative embodiment for the power loss computer LR according to FIG. 5.

As can be seen in FIG. 8, the generation of this time-variable nominal voltage Vsoll(t) as the command variable can take place by means of a microcontroller µC in which the course of the nominal voltage Vsoll(t) in time is stored in a table T. Therefore, the hardware-specific or software-specific differentiators and multipliers become unnecessary according to FIGS. 5 and 6.

In this embodiment, the absolute value of the differential voltage Vdiffabs (output voltage of the second differential amplifier A2 in FIG. 4) is directly supplied to the inverting input of the two-state controller K2 and the input of the microcontroller µC. This differential voltage Vdiffabs is then first of all converted to A/D in the microcontroller µC.

By means of the command not shown here for equalizing the charge of the two energy storage devices (here C1 and DLC) connected to the switch (here S2), starting (FIG. 7) at the point in time (to) at which the start value Vsoll(to) corresponds to the differential voltage Vdiffabs at this point in time (to) and which is taken from the table T, the time-variable nominal voltage Vsoll(t) is supplied after D/A conversion to the non-inverting input of the two-state controller K2 via switch S3 and is plotted according to the curve shown in FIG. 7 until it becomes zero at the point in time t1.

Therefore, the charge equalizing between the two energy storage devices is carried out with a predetermined, constant power loss from the switch, which has ended at the point in time t1.

We claim:

1. A method for switching a semiconductor circuit breaker, which comprises the steps of:
controlling a resistance of a breaker gap of the semiconductor circuit breaker by a control voltage such that a power loss from the semiconductor circuit breaker does not exceed a predetermined setpoint and allows continuous operation at the predetermined setpoint and regulates the power loss to the predetermined setpoint.

2. The method according to claim 1, which further comprises determining the power loss of the semiconductor circuit breaker by the steps of:
generating from a difference voltage tapped from between connection terminals of the semiconductor circuit breaker, an absolute value of the difference voltage in reference to a reference potential;
determining a differential of the absolute value of the difference voltage over time;
according to formula:

$$Pist=V_S*I_S=Vdiffabs*d(Vdiffabs)/dt*C1,$$

where
Pist=power loss,
Vdiffabs=the absolute value of the difference voltage,
$V_S$=switch voltage=Vdiffabs,
$I_S$=d(Vdiffabs)/dt*C1,
C1=const,
multiplying the differential d(Vdiffabs)/dt over time by the absolute value Vdiffabs and the constant value C1, in which case a product of the semiconductor circuit breaker corresponds to the power loss Pist; and
regulating the power loss to the predetermined setpoint resulting in a controlled variable serving as a control signal for generating the control voltage.

3. The method according to claim 1, which further comprises:
determining from a difference voltage tapped from between connection terminals of the semiconductor circuit breaker, an absolute value of the difference voltage in reference to a reference potential;
determining and storing from known or measurable system variables selected from the group consisting of capacity, the absolute value of the difference voltage and a constant power of the switch, a time-variable nominal voltage allocated to the constant power of the switch for a process of reversing a charge; and
using the time-variable nominal voltage as a command variable for regulating the absolute value of the difference voltage for the process of reversing the charge starting with the absolute value of the difference voltage at a start of the process of reversing the charge up to a point in time when the process of reversing the charge has ended and the absolute value of the difference voltage =0V, resulting in a controlled variable serving as a control signal for generating the control voltage.

4. A semiconductor circuit breaker system disposed between two energy storage devices in a wiring system of a vehicle equipped with an integrated starter generator, the system comprising:
a circuit breaker embodied as a transfer gate having two semiconductors connected in series and connection terminals, said circuit breaker having an off-state in which at least one of said semiconductors is blocked; and
a charge pump generating a control voltage impressed across a gate terminal and a source terminal of said semiconductors of said circuit breaker, said charge pump controlling said semiconductors of said circuit breaker, in a conductive state, such that in each case said semiconductors only being controlled to such an extent that a power loss from said circuit breaker does not exceed a predetermined setpoint and allows continuous operation at the predetermined setpoint and regulates the power loss to the predetermined setpoint.

5. The system according to claim 4, wherein:
said two semiconductors are connected in series and have interconnected gate connections and interconnected source connections;
said transfer gate has a transistor with a collector emitter path disposed between said interconnected gate connections and said interconnected source connections of said two semiconductors connected in series, said transistor can be shifted by an external signal to a conductive state in order to control said transfer gate quickly to a non-conductive state.

6. The system according to claim 4, wherein for determining the power loss from said circuit breaker, the system further comprising:
a voltage transmitter receiving a difference voltage tapped from between said connection terminals of said circuit breaker, said voltage transmitter forming an absolute value of the difference voltage in reference to a reference potential from the difference voltage;
a differentiator connected to said voltage transmitter and generating a differential value of the absolute value of the difference voltage over time; and
a multiplier connected to said differentiator and multiplies the differential, value of the absolute value of the difference voltage over time by the absolute value of the difference voltage and a constant value resulting in an output signal conforming to the power loss of said circuit breaker.

7. The system according to claim 4, further comprising:
a microcontroller for digitally determining the power loss;
a voltage transmitter receiving a difference voltage tapped from between said connection terminals of said circuit breaker, said voltage transmitter forming an absolute value of the difference voltage in reference to a reference potential from the difference voltage, said voltage transmitter having a differential amplifier outputting an output signal;
an A/D converter which continuously digitizes the output signal of said differential amplifier resulting in a digitalized signal;
an intermediate storage device connected to said A/D converter and storing the digitalized signal;
a digital differentiator connected to said intermediate storage device and differentiating the digitalized signal into a differentiated signal;
a digital multiplier multiplying the digitalized signal with the differentiated signal and a constant to a value corresponding to the power loss of said circuit breaker, said digital multiplier outputting a digital power loss signal; and
a D/A converter connected to said digital multiplier and converting the digital power loss signal into an analog value.

8. The system according to claim 6, further comprising a controller connected to said digital multiplier, said controller regulating the power loss to the predetermined setpoint, said controller outputting an output signal being a controlled variable supplied as a control signal to said charge pump to generate the control voltage.

9. The system according to claim 8, wherein said controller is a two-state controller.

10. The system according to claim 4, further comprising:
a voltage transmitter receiving a difference voltage tapped from between said connection terminals of said circuit breaker and forms an absolute value of the difference voltage in reference to a reference potential;
a microcontroller receiving the absolute value of the difference voltage, said microcontroller storing a time-variable nominal voltage in a table; and
a controller having an inverting input receiving the absolute value of the difference voltage and a non-inverting input receiving the time-variable nominal voltage, said controller outputting an output signal being a controlled variable functioning as a control signal supplied to said charge pump to generate the control voltage.

* * * * *